US010367017B2

(12) United States Patent
Xu

(10) Patent No.: US 10,367,017 B2
(45) Date of Patent: Jul. 30, 2019

(54) ARRAY SUBSTRATE AND MANUFACTURING METHOD THEREOF

(71) Applicant: Shenzhen China Star Optoelectronics Semiconductor Display Technology Co., Ltd., Shenzhen (CN)

(72) Inventor: Hongyuan Xu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 0 days.

(21) Appl. No.: 15/740,009

(22) PCT Filed: Nov. 30, 2017

(86) PCT No.: PCT/CN2017/113698
§ 371 (c)(1),
(2) Date: Dec. 27, 2017

(87) PCT Pub. No.: WO2019/100428
PCT Pub. Date: May 31, 2019

(65) Prior Publication Data
US 2019/0157316 A1    May 23, 2019

(30) Foreign Application Priority Data
Nov. 22, 2017 (CN) .......................... 2017 1 1171967

(51) Int. Cl.
*H01L 27/12* (2006.01)
*H01L 21/428* (2006.01)
(Continued)

(52) U.S. Cl.
CPC ........ *H01L 27/1288* (2013.01); *H01L 21/428* (2013.01); *H01L 21/477* (2013.01);
(Continued)

(58) Field of Classification Search
CPC . H01L 27/1288; H01L 21/428; H01L 21/477; H01L 27/1225; H01L 27/127; H01L 29/247; H01L 29/66969; H01L 29/78618; H01L 29/78633; H01L 29/78693
See application file for complete search history.

(56) References Cited

U.S. PATENT DOCUMENTS

2002/0094613 A1\* 7/2002 Yamazaki ............. H01L 21/268
438/151
2006/0255719 A1\* 11/2006 Oikawa ............... H01L 51/5206
313/503
(Continued)

*Primary Examiner* — Fernando L Toledo
*Assistant Examiner* — Neil R Prasad
(74) *Attorney, Agent, or Firm* — Mark M. Friedman

(57) ABSTRACT

An array substrate and a method of manufacturing the array substrate are provided. The method includes providing a substrate, sequentially forming a light-shielding layer, a buffer layer, an active layer, a source, a drain, a gate insulating layer, and a gate on the substrate, performing a first conductorization process on a corresponding region of the active layer opposite to the source and the drain, and performing a second conductorization process on another corresponding region of the active layer between the source and the gate and between the drain and the gate.

9 Claims, 4 Drawing Sheets

(51) Int. Cl.
*H01L 29/66* (2006.01)
*H01L 29/24* (2006.01)
*H01L 29/786* (2006.01)
*H01L 21/477* (2006.01)

(52) U.S. Cl.
CPC ........ *H01L 27/127* (2013.01); *H01L 27/1225* (2013.01); *H01L 29/247* (2013.01); *H01L 29/66969* (2013.01); *H01L 29/78618* (2013.01); *H01L 29/78633* (2013.01); *H01L 29/78693* (2013.01)

(56) References Cited

U.S. PATENT DOCUMENTS

2007/0037352 A1* 2/2007 Suzawa ............... H01L 27/3258
438/282
2010/0171120 A1* 7/2010 Gosain ................. G02F 1/1368
257/59
2017/0117304 A1* 4/2017 Kim .................... H01L 27/1251

* cited by examiner

ARRAY SUBSTRATE AND MANUFACTURING METHOD THEREOF

FIELD OF INVENTION

The present disclosure relates to the field of display technologies, and more particularly to an array substrate and a manufacturing method thereof.

BACKGROUND OF INVENTION

Oxide semiconductors are one type of oxide with semiconductor characteristics. Oxide semiconductor thin film transistors (TFTs), as a next-generation of basic electronic material, have drawn the attention of global display technicians. Oxide semiconductor TFTs are one preferred candidate for TFT material configured to drive next-generation displays such as ultra-high definition (UHD) liquid crystal panels (LCDs), organic electroluminescent (EL) panels, and electronic paper.

IGZO is an abbreviation of indium gallium zinc oxide. Amorphous IGZO material is channel layer material used in next-generation of TFT technologies and is one metal oxide panel technology. Carrier mobility of IGZO is 20 to 30 times than carrier mobility of amorphous silicon, thus greatly improving charge-discharge rate of the TFT to a pixel electrode. It has a fast refresh rate and a fast response time and is configured to greatly improve pixel scan rate, such that an ultra-high resolution in TFT LCDs is possible. In addition, IGZO displays have highly energy efficient and are more efficient due to a reduced number of transistors and an increased light transmittance of each pixel.

IGZO-TFT devices are generally divided into several types of electronic shelf labels (ESL), back channel etching (BCE), top gates (TG), etc., ESL and BCE structures, due to a large overlap area between a gate electrode and a source/drain electrode, have large parasitic capacitance, and are not suitable for high resolution OLED panels. IGZO devices with top-gate structures developed in recent years can solve the problem of large parasitic capacitance. However, the current mainstream TG-IGZO TFT devices have a complicated manufacturing process and generally require about seven masks to complete the array substrate process.

In summary, manufacturing methods of TG-IGZO TFT devices in existing technologies are complicated and costs are high.

SUMMARY OF INVENTION

An object of the present disclosure is to provide an array substrate and a manufacturing method thereof capable of reducing mask processes of a TG-IGZO TFT device and reducing costs.

To achieve the above object, an embodiment of the present disclosure provides a method of manufacturing an array substrate, including the following steps:

Step S1: providing a substrate, sequentially forming a light-shielding layer, a buffer layer, an active layer, a source, a drain, a gate insulating layer, and a gate on the substrate, wherein an indium gallium zinc oxide layer and a second metal layer are continuously deposited on the buffer layer, and, using a halftone mask, the indium gallium zinc oxide layer is formed into the active layer and the second metal layer is formed simultaneously into the source and the drain;

Step S2: performing a first conductorization process on a corresponding region of the active layer opposite to the source and the drain; and Step S3: performing a second conductorization process on another corresponding region of the active layer between the source and the gate and between the drain and the gate.

In an embodiment of the present disclosure, the first conductorization process includes performing an annealing process on the array substrate, and the second conductorization process includes performing a laser process on the array substrate.

In an embodiment of the present disclosure, a temperature of the annealing process ranges from 200 to 300 degrees Celsius, such that the corresponding region of the active layer opposite to the source and the drain becomes conductive.

In an embodiment of the present disclosure, a surface of the array substrate is irradiated with an excimer laser light having a wavelength in a range of 300 nm to 315 nm in the laser process, such that the another corresponding region of the active layer between the source and the gate and between the drain and the gate becomes conductive.

In an embodiment of the present disclosure, in the annealing process, titanium or aluminum of the source and the drain is doped in the active layer.

The present disclosure further provides an array substrate, including:

a substrate;
a thin film transistor formed on the substrate, the thin film transistor including an active layer, a source, and a drain, the source and the drain correspondingly disposed on two ends of the active layer;
a gate insulating layer formed on a surface of the thin film transistor; and
a gate formed on the gate insulating layer;
wherein the active layer is made of indium gallium zinc oxide, a region of the active layer corresponding to the gate is a non-conductive region, another region of the active layer excluding the non-conductive region is a conductive region, the conductive region corresponding to a side of the source is a source region, the conductive region corresponding to a side of the drain is a drain region, the array substrate includes a channel region configured to form carriers, the non-conductive region of the active layer is an active layer of the channel region, and the active layer of the channel region extends to the source region and a corresponding portion of the active layer opposite to the drain region.

In an embodiment of the present disclosure, the source region and the drain region of the active layer become conductive by annealing the substrate at 200 to 300 degrees Celsius and irradiating the substrate with an excimer laser light having a wavelength in a range of 300 nm to 315 nm.

The present disclosure further provides an array substrate, including:

a substrate;
a thin film transistor formed on the substrate, the thin film transistor including an active layer, a source, and a drain, the source and the drain correspondingly disposed on two ends of the active layer;
a gate insulating layer formed on a surface of the thin film transistor; and
a gate formed on the gate insulating layer;
wherein the active layer is made of indium gallium zinc oxide, a region of the active layer corresponding to the gate is a non-conductive region, another region of the active layer excluding the non-conductive region is a conductive region, the conductive region corresponding to a side of the source is a source region, and the conductive region corresponding to a side of the drain is a drain region.

In an embodiment of the present disclosure, the source region and the drain region of the active layer become conductive by annealing the substrate at 200 to 300 degrees Celsius and irradiating the substrate with an excimer laser light having a wavelength in a range of 300 nm to 315 nm.

Compared with the manufacturing method of the TG-IGZO TFT device in the existing technologies, the method of manufacturing the array substrate of the embodiment of the present disclosure includes continuously depositing the indium gallium zinc oxide layer and the second metal layer on the buffer layer. The same halftone mask is used, such that the indium gallium zinc oxide layer is formed into the active layer and the second metal layer is formed simultaneously into the source and the drain. The annealing process on the array substrate is performed, such that the corresponding region of the indium gallium zinc oxide layer opposite to the source and the drain becomes conductive. The substrate is irradiated with the excimer laser light, such that the another corresponding region of the indium gallium zinc oxide layer between the source/drain and the gate becomes conductive. The method of the embodiment saves two masks, and uses five masks to complete the production of display devices, thereby reducing processes and reducing costs.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
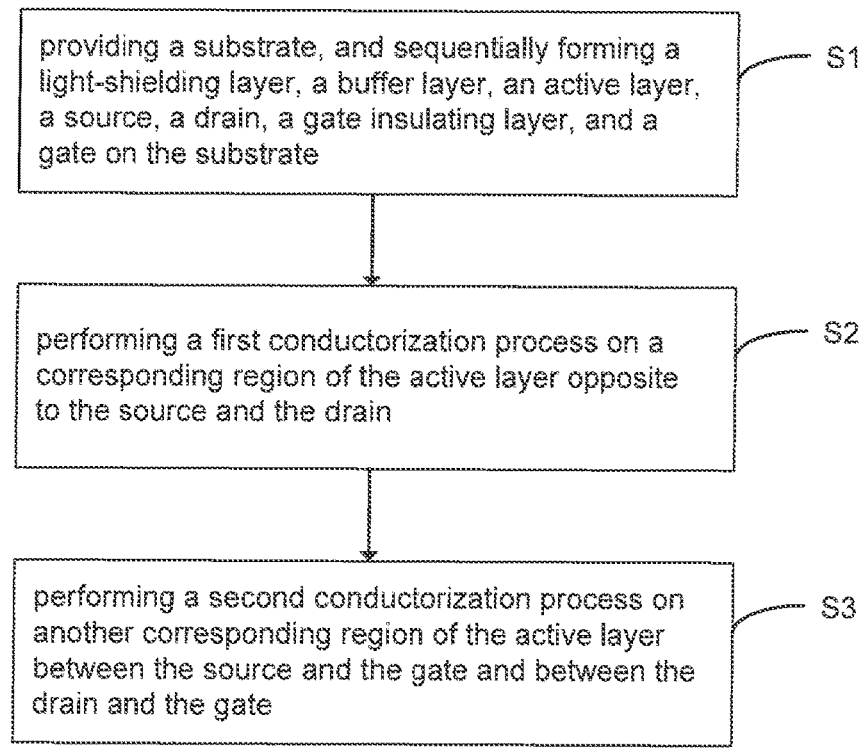
FIG. 1 is a flowchart of a method for manufacturing an array substrate according to an embodiment of the present disclosure.

The embodiments described herein with reference to the accompanying drawings are explanatory, illustrative, and used to generally understand the present disclosure. Furthermore, directional terms described by the present disclosure, such as top, bottom, front, rear, left, right, inner, outer, side, etc., are only directions by referring to the accompanying drawings, and thus the used terms are used only for the purpose of describing embodiments of the present disclosure and are not intended to be limiting of the present disclosure. In the drawings, modules with similar structures are labeled with the same reference number.

The present disclosure aims at solving the technical problem of the method of manufacturing TG-IGZO TFT devices in the existing technologies having complicated processes and high costs. An embodiment of the present disclosure can solve the problem.

A method of manufacturing an array substrate according to an embodiment of the present disclosure will be described in detail below with reference to the accompanying drawings.

Refer to FIG. 1, an embodiment of the present disclosure provides a method of manufacturing an array substrate. The method includes the following steps:

Step S1: providing a substrate, and sequentially forming a light-shielding layer, a buffer layer, an active layer, a source, a drain, a gate insulating layer, and a gate on the substrate.

Step S2: performing a first conductorization process on a corresponding region of the active layer opposite to the source and the drain.

Step S3: performing a second conductorization process on another corresponding region of the active layer between the source and the gate and between the drain and the gate.

In detail, the method of manufacturing the array substrate may include the following steps:

Step S101: sequentially forming a first metal layer and the buffer layer on the substrate, and forming the first metal layer into the light-shielding layer using a first mask.

Step S102: continuously depositing an indium gallium zinc oxide layer and a second metal layer on the buffer layer, and, using a second halftone mask, forming the indium gallium zinc oxide layer into the active layer, and simultaneously forming the second metal layer into the source and the drain.

Step S103: sequentially forming the gate insulating layer and a third metal layer, and forming the third metal layer into the gate using a third mask.

Step S104: performing a conductorization process on another region of the active layer excluding a first region corresponding to the gate. The conductorization process includes performing the first conductorization process on the corresponding region of the active layer opposite to the source and the drain and performing the second conductorization process on another corresponding region of the active layer between the source and the gate and between the drain and the gate.

Step S105: covering the gate with a passivation layer and forming a via in the passivation layer using a fourth mask.

Step S106: depositing a pixel electrode layer on the passivation layer and forming the pixel electrode using a fifth mask.

The manufacturing process of the array substrate provided in the embodiments of the present disclosure will be described in detail below with reference to the accompanying drawings.

Figure 2A:
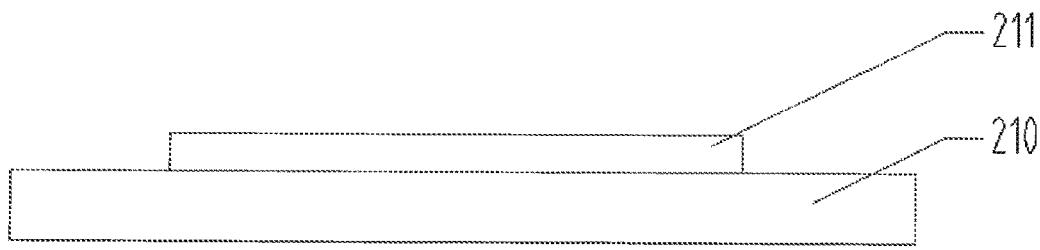
FIG. 2A is a schematic structural diagram of a stage in a manufacturing process of an array substrate according to an embodiment of the present disclosure.

Refer to FIG. 2A, a substrate 210 is provided. A first metal layer is formed on the substrate 210. The first metal layer is patterned and formed into a light-shielding layer 211 arranged at intervals on the substrate 210 using a first photomask.

Figure 2B:
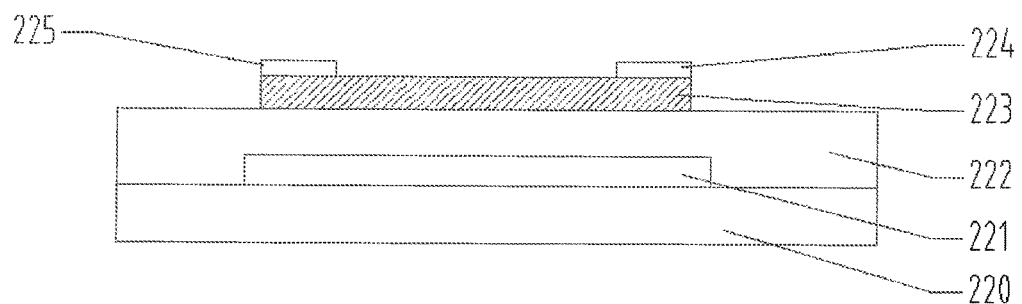
FIG. 2B is a schematic structural diagram of a stage in a manufacturing process of an array substrate according to an embodiment of the present disclosure.

Refer to FIG. 2B, a buffer layer 222 is deposited on a substrate 220. The buffer layer 222 covers the light-shielding layer 221. Indium gallium zinc oxide (IGZO) and a second metal layer are continuously deposited on the buffer layer 222. Indium gallium zinc oxide and the second metal layer are simultaneously patterned using a second halftone mask, such that indium gallium zinc oxide forms an indium gallium zinc oxide pattern, that is, an active layer 223. The second metal layer forms a source 225 and a drain 224. The source 225 and the drain 224 are correspondingly disposed on two ends of the active layer 223. There is a gap between the source 225 and the drain 224. Projections of the source 225, the drain 224, and the active layer 223 on the substrate 220 are located within a projection of the light-shielding layer 221 on the substrate 220.

It is to be understood that the second metal layer is made of one or more of titanium or aluminum. If the second metal layer is made of composite material of titanium and aluminum, the second metal layer is a stacked structure including titanium and aluminum. The buffer layer 222 is made of silicon nitride or silicon dioxide.

Figure 2C:
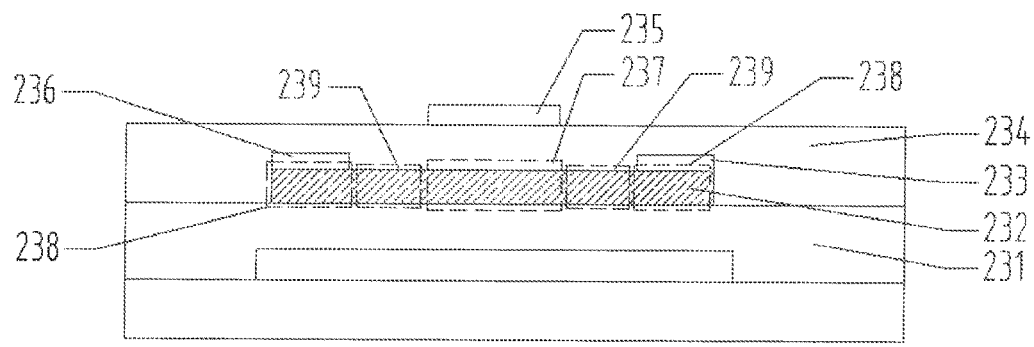
FIG. 2C is a schematic structural diagram of a stage in a manufacturing process of an array substrate according to an embodiment of the present disclosure.

Refer to FIG. 2C, a gate insulating layer 234 is then deposited on the buffer layer 231. The gate insulating layer 234 covers a patterned source 236, a patterned drain 233, and the active layer 232. Then, the gate insulating layer 234 is deposited on a third metal layer. The third metal layer is formed into a gate 235 using a third photomask. The gate 235 is correspondingly located between the source 236 and the drain 233. In the active layer 232, a corresponding region corresponding to the gate 235 is a first region 237, another corresponding region corresponding to the source 236 and the drain 233 is a second region 238. A region corresponding to a gap between the gate 235 and the source 236/the drain 233 is a third region 239. The gate insulating layer 234 is made of silicon nitride or silicon dioxide.

Figure 2D:
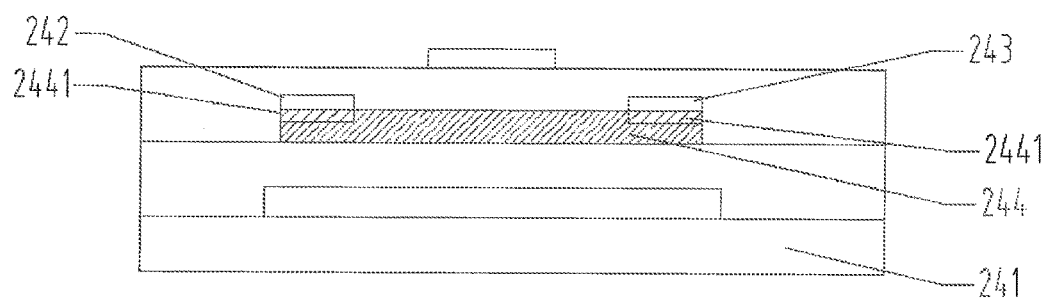
FIG. 2D is a schematic structural diagram of a stage in a manufacturing process of an array substrate according to an embodiment of the present disclosure.

Refer to FIG. 2D, the array substrate is subjected to a first conductorization process. The first conductorization process includes an annealing process. In detail, a substrate 241 is annealed at 200~300 degrees Celsius for a certain period of time, such that a second region 2441 of an active layer 244 below a source 242 and a drain 243 becomes conductive. In the process, titanium or aluminum of the source 242 and the drain 243 may be doped in the active layer 244 to be slowly cooled after titanium or aluminum tends to be uniformly distributed and diffused in the active layer 244, such that the second region 2441 becomes conductive.

Figure 2E:
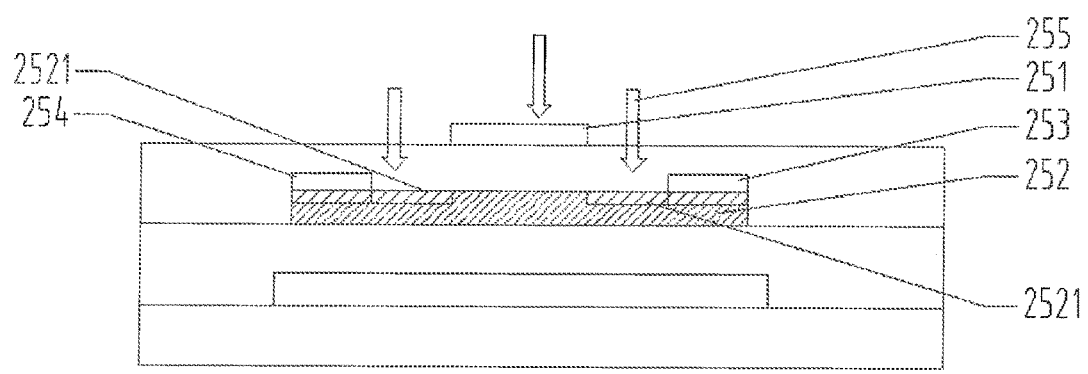
FIG. 2E is a schematic structural diagram of a stage in a manufacturing process of an array substrate according to an embodiment of the present disclosure.

Refer to FIG. 2E, the array substrate is subjected to a second conductorization process. The second conductorization process includes a laser process. In detail, a corresponding region of an active layer 252 corresponding to a gate 251 is the first region (as shown in FIG. 2C), a region corresponding to a gap between the gate 251 and a source 254/a drain 253 is a third region 2521. A surface of a side of the gate 251 of the substrate is irradiated with an excimer laser light having a wavelength in a range of 300 nm to 315 nm along an irradiation direction 255, such that a third region 2521 of the active layer 252 corresponding between the gate 251 and the source 254/the drain 253 becomes conductive. The first region of the active layer 252 covered by the gate 251 is a non-conductive region and can be avoided as a conductive layer as an active layer of a channel region. By the above-mentioned annealing process and the laser process, the active layer 252 is self-aligning.

Figure 2F:
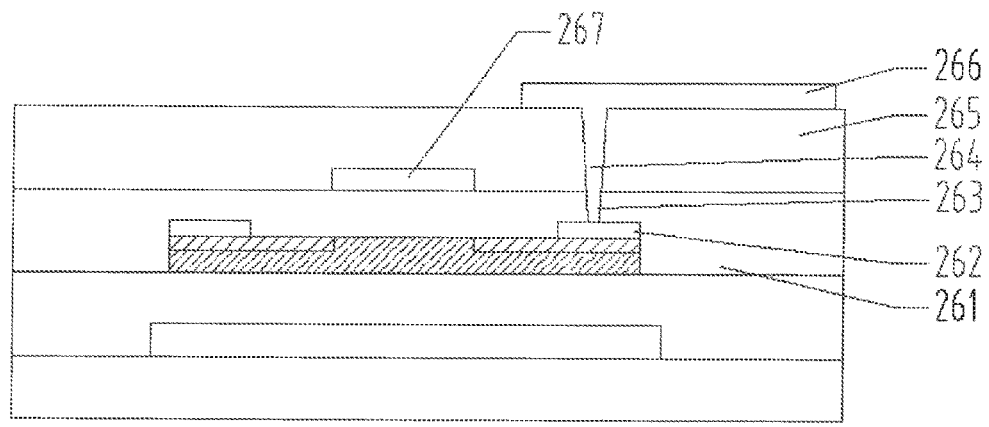
FIG. 2F is a schematic structural diagram of a stage in a manufacturing process of an array substrate according to an embodiment of the present disclosure.

Refer to FIG. 2F, a passivation layer 265 is covered on the surface of the substrate on which a gate 267 is formed, and a second via 264 is formed on the passivation layer 265 using a fourth photomask. A first via 263 corresponding to the second via 264 is formed on a gate insulating layer 261. A pixel electrode layer is then deposited and a pixel electrode 266 is formed using a fifth photomask. The pixel electrode 266 passing through the second via 264 and the first via 263 are connected to a drain 262. Five masks are used in the processes of manufacturing a top gate structure of the array substrate.

An embodiment of the present disclosure further provides an array substrate. The array substrate includes a substrate, a thin film transistor, a gate insulating layer, and a gate. The thin film transistor is formed on the substrate. The thin film transistor includes an active layer, a source, and a drain. The source and the drain are correspondingly disposed on two ends of the active layer. The gate insulating layer is formed on a surface of the thin film transistor. The gate is formed on the gate insulating layer. The active layer is made of indium gallium zinc oxide. A region of the active layer corresponding to the gate is a non-conductive region, and another region of the active layer excluding the non-conductive region is a conductive region. The conductive region corresponding to a side of the source is a source region, and the conductive region corresponding to a side of the drain is a drain region.

Figure 3:
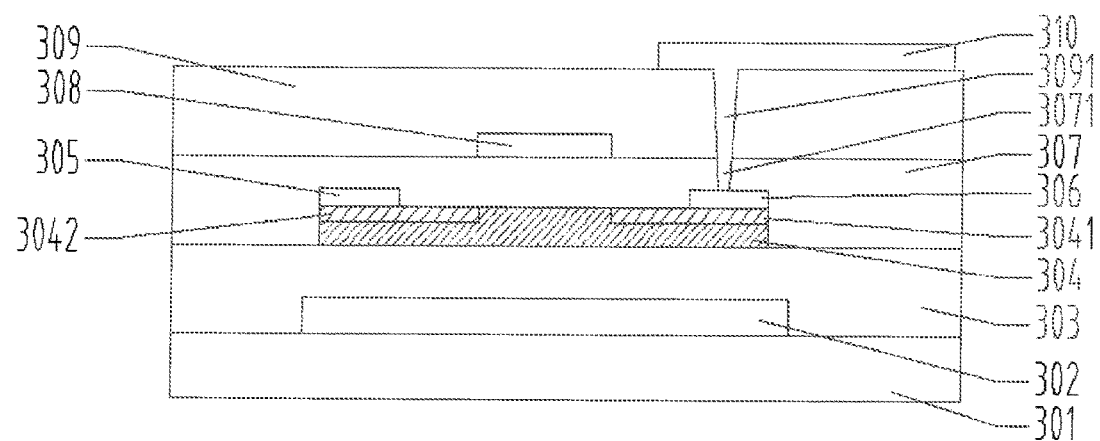
FIG. 3 is a schematic structural diagram of an array substrate according to an embodiment of the present disclosure.

Refer to FIG. 3, a schematic structural diagram of an array substrate of an embodiment of the present disclosure is provided. The array substrate includes a substrate 301, a first metal layer, a buffer layer 303, an indium gallium zinc oxide layer, a gate insulating layer 307, a passivation layer 309, and a pixel electrode layer. The first metal layer is formed on a surface of the substrate 301. The first metal layer is formed into a light-shielding layer arranged at intervals. The buffer layer 303 is formed on a surface of the first metal layer. The indium gallium zinc oxide layer is deposited on a surface of the buffer layer 303. The indium gallium zinc oxide layer is patterned to form an active layer 304. A second metal layer is deposited on a surface of the indium gallium zinc oxide layer. The second metal layer is patterned to form a source 305 and a drain 306. The gate insulating layer 307 is formed on a surface of the second metal layer. A third metal layer is formed on a surface of the gate insulating layer 307 and is patterned to form a gate 308. The passivation layer 309 is formed on a surface of the third metal layer. The pixel electrode layer is formed on a surface of the passivation layer 309. The pixel electrode layer is patterned to form a pixel electrode 310.

The active layer 304 includes a conductive area and a non-conductive area. The conductive area includes a first conductive area 3042 and a second conductive area 3041. The indium gallium zinc oxide layer and the second metal layer are simultaneously patterned by a halftone mask. The first conductive region 3042 of the active layer 304 corresponding to a side of the source 305 is a source region of the active layer 304 and the second conductive region 3041 corresponding to a side of the drain 306 is a drain region of the active layer 304. The source region and the drain region become conductive by annealing the substrate 301 at 200 to 300 degrees Celsius and irradiating the substrate 301 with an excimer laser light having a wavelength in a range of 300 to 315 nanometers. The array substrate includes a channel region configured to form carriers. The active layer in the non-conductive region is an active layer of the channel region. The active layer of the channel region extends to the source region and a corresponding portion of the active layer opposite to the drain region. The gate insulating layer 307 includes a first via 3071. The passivation layer 309 includes a second via 3091 corresponding to the first via 3071. The pixel electrode 310 passing through the second via 3091 and the first via are connected to the drain 306.

Compared with the manufacturing method of the TG-IGZO TFT device in the existing technologies, the method of manufacturing the array substrate of the embodiment of the present disclosure includes continuously depositing the indium gallium zinc oxide layer and the second metal layer on the buffer layer. The same halftone mask is used, such that the indium gallium zinc oxide layer is formed into the active layer and the second metal layer is formed simultaneously into the source and the drain. The annealing process on the array substrate is performed such that the corresponding region of the indium gallium zinc oxide layer opposite to the source and the drain becomes conductive. The substrate is irradiated with the excimer laser light such that the another corresponding region of the indium gallium zinc oxide layer between the source/drain and the gate becomes conductive. The method of the embodiment saves two masks, and uses five masks to complete the production of display devices, thereby reducing processes and reducing costs.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

The invention claimed is:

1. A method of manufacturing an array substrate, comprising the following steps:
   Step S1: providing a substrate, sequentially forming a light-shielding layer, a buffer layer, an active layer, a source, a drain, a gate insulating layer, and a gate on the substrate, wherein an indium gallium zinc oxide layer and a second metal layer are continuously deposited on the buffer layer using a halftone mask, and, using the halftone mask, the indium gallium zinc oxide layer is formed into the active layer and the second metal layer is formed simultaneously into the source and the drain;
   Step S2: performing a first conductorization process on a corresponding region of the active layer opposite to the source and the drain; and
   Step S3: performing a second conductorization process on another corresponding region of the active layer between the source and the gate and between the drain and the gate;
   wherein locations of projections of the source, the drain, and the active layer on the substrate within a projection of the light-shielding layer on the substrate cause self-aligning of the active layer; and
   wherein use of the halftone mask causes the active layer, the source, and the drain to be simultaneously formed.

2. The method according to claim 1, wherein the first conductorization process comprises performing an annealing process on the array substrate, and the second conductorization process comprises performing a laser process on the array substrate.

3. The method according to claim 2, wherein a temperature of the annealing process ranges from 200 to 300 degrees Celsius, such that the corresponding region of the active layer opposite to the source and the drain becomes conductive.

4. The method according to claim 2, wherein a surface of the array substrate is irradiated with an excimer laser light having a wavelength in a range of 300 nm to 315 nm in the laser process, such that the another corresponding region of the active layer between the source and the gate and between the drain and the gate becomes conductive.

5. The method according to claim 3, wherein in the annealing process, titanium or aluminum of the source and the drain is doped in the active layer.

6. An array substrate, comprising:
   a substrate;
   a thin film transistor formed on the substrate, the thin film transistor comprising an active layer, a source, and a drain, the source and the drain correspondingly disposed on two ends of the active layer;
   a gate insulating layer formed on a surface of the thin film transistor; and
   a gate formed on the gate insulating layer;
   wherein the active layer is made of indium gallium zinc oxide, a region of the active layer corresponding to the gate is a non-conductive region, another region of the active layer excluding the non-conductive region is a conductive region, the conductive region corresponding to a side of the source is a source region, the conductive region corresponding to a side of the drain is a drain region, the array substrate comprises a channel region configured to form carriers, the non-conductive region of the active layer is an active layer of the channel region, and the active layer of the channel region extends to the source region and a corresponding portion of the active layer opposite to the drain region;
   wherein locations of projections of the source, the drain, and the active layer on the substrate within a projection of a light-shielding layer on the substrate cause self-aligning of the active layer.

7. The array substrate according to claim 6, wherein the source region and the drain region of the active layer become conductive by annealing the substrate at 200 to 300 degrees Celsius and irradiating the substrate with an excimer laser light having a wavelength in a range of 300 nm to 315 nm.

8. An array substrate, comprising:
   a substrate;
   a thin film transistor formed on the substrate, the thin film transistor comprising an active layer, a source, and a drain, the source and the drain correspondingly disposed on two ends of the active layer;
   a gate insulating layer formed on a surface of the thin film transistor; and
   a gate formed on the gate insulating layer;
   wherein the active layer is made of indium gallium zinc oxide, a region of the active layer corresponding to the gate is a non-conductive region, another region of the active layer excluding the non-conductive region is a conductive region, the conductive region corresponding to a side of the source is a source region, and the conductive region corresponding to a side of the drain is a drain region;
   wherein locations of projections of the source, the drain, and the active layer on the substrate within a projection of a light-shielding layer on the substrate cause self-aligning of the active layer.

9. The array substrate according to claim 8, wherein the source region and the drain region of the active layer become conductive by annealing the substrate at 200 to 300 degrees Celsius and irradiating the substrate with an excimer laser light having a wavelength in a range of 300 nm to 315 nm.

\* \* \* \* \*